(12) United States Patent
Mitsuhashi

(10) Patent No.: US 6,440,815 B1
(45) Date of Patent: Aug. 27, 2002

(54) DIELECTRIC CAPACITOR AND ITS MANUFACTURING METHOD

(75) Inventor: Toshiro Mitsuhashi, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/040,448

(22) Filed: Jan. 9, 2002

(30) Foreign Application Priority Data

May 22, 2001 (JP) ........................................ 2001-152714

(51) Int. Cl.[7] .............................................. H01L 21/20
(52) U.S. Cl. ...................................................... 438/396
(58) Field of Search ................................ 438/393, 396, 438/394–395, 397–399, 386–392, 381

(56) References Cited

U.S. PATENT DOCUMENTS 6,329,681 B1 * 12/2001 Nakamura et al. ........... 257/297

FOREIGN PATENT DOCUMENTS

JP        2000-164815       6/2000

OTHER PUBLICATIONS

Patent Abstracts of Japan, Publication No. 2000-164815, published Jun. 16, 2000.

* cited by examiner

Primary Examiner—Craig Thompson
(74) Attorney, Agent, or Firm—Venable; Norman N. Kunitz

(57) ABSTRACT

This invention provides a dielectric capacitor and its manufacturing method showing a good electric characteristic by preventing an external substance such as a reducing element from entering and diffusing into a dielectric film. In a ferroelectric capacitor C103, a first hydrogen diffusion prevention film 101 can prevent hydrogen generated during the film formation processes of oxide films 7 and 9 from entering and diffusing into a ferroelectric film 4. In addition, since the side wall part of the ferroelectric film 4 is covered with a second hydrogen diffusion prevention film 102, hydrogen is to be completely prevented from entering the internal part of the ferroelectric film 4 from the side wall part thereof. Consequently, the electric characteristic of the ferroelectric film 4 can be kept in good state. Further, since the second hydrogen diffusion prevention film 102 does not exist on the upper surface of the oxide film 7, the height of the ferroelectric capacitor C103 is to be minimized at a required level. This is advantageous for an entire part of a semiconductor device provided with the ferroelectric capacitor C103 to be made flat.

13 Claims, 10 Drawing Sheets

DIELECTRIC CAPACITOR AND ITS MANUFACTURING METHOD

BACKGROUND OF THE INVENTION

1. Field of the Invention

The present invention relates to a dielectric capacitor and its manufacturing method.

2. Related Art

Recently with the widespread use of a portable data terminal such as a cell phone and the like, there is a growing need of nonvolatile memory. FeRAM (Ferroelectric RAM), MRAM (Magnetic RAM), phase change memory, and the like as well as flash EEPROM already manufactured widely have attracted the attention as next-generation nonvolatile memory. FeRAM, especially, is leading other next-generation nonvolatile memory in manufacturing.

DRAM, typical volatile semiconductor memory, is provided with a paraelectric capacitor as a memory element while FeRAM with a ferroelectric capacitor as a memory element.

The ferroelectric capacitor comprises a lower electrode, an upper electrode and a ferroelectric film between the electrodes in FeRAM. When the ferroelectric film and the lower electrode are processed in manufacturing a semiconductor, there is a fear that the upper electrode is damaged under the influence on the upper electrode caused by the process. To prevent this, an upper electrode is generally formed with the area smaller than those of a ferroelectric film and a lower electrode.

In many cases, it is difficult to process the materials used to form a ferroelectric capacitor. For this reason, if a resist film is used as an etching mask, this resist film recedes during the etching and disappears in the worst case with an insufficient etching selective ratio. If the resist film disappears, the ferroelectric film is damaged by etching and as a result, the electric characteristic of the ferroelectric capacitor is to be deteriorated. To solve this problem, an oxide film with which an etching selective ratio higher than that of the resist film can be obtained is conventionally used as an etching mask.

Hereinafter, a conventional method for manufacturing a ferroelectric capacitor in which an oxide film is used as an etching mask. FIG. 20 is a sectional view of a conventional ferroelectric capacitor C1, and FIGS. 13–19 are sectional views showing each manufacturing step.

[Step 1] An adhesion layer (Ti, 100) 2 and a lower electrode (Pt, 2000) 3 are formed by spattering on an oxide film (SiO$_2$) 1 formed by CVD method. Next, a ferroelectric film (SBT: SrBi$_2$Ta$_2$O$_9$, 2000) 4 is formed on the lower electrode 3 with a spin coat method. Further, an upper electrode (Pt, 2000) 5 is formed on the ferroelectric film 4 by spattering (FIG. 13).

[Step 2] After a resist film 6 is formed, the resist film 6 is patterned by using a photolithography (FIG. 14).

[Step 3] The upper electrode 5 is etched by using the resist film 6 as a mask. A dry-etching method is used here (FIG. 15).

[Step 4] The resist film 6 is removed by ashing with O$_2$ plasma (FIG. 16).

[Step 5] An oxide film (4000) 7 is formed by CVD method. After a resist film 8 is formed on the oxide film 7, the resist film 8 is patterned by using a photolithography (FIG. 17).

[Step 6] The oxide film 7 is etched by using the resist film 8 as a mask. A dry-etching method is used here. And the resist film 8 is removed by ashing with O$_2$ plasma (FIG. 18).

[Step 7] The oxide film 7 is used as a mask, and the ferroelectric film 4, the lower electrode 3 and the adhesion layer 2 are processed with a dry-etching method (FIG. 19).

[Step 8] An oxide film (3000) 9 is formed by CVD method (FIG. 20). The oxide film 9 protects the ferroelectric capacitor.

The conventional ferroelectric capacitor C1 is manufactured through the above steps from 1 to 8.

Since SBT, constituent for the ferroelectric film 4, is oxide, there is a fear that the electric characteristic such as a dielectric constant is to be deteriorated when SBT is exposed to a reducing atmosphere such as hydrogen gas. However, since the oxide films 7 and 9 are formed by CVD method as described above, it is difficult to avoid the generation of hydrogen gas. When the oxide films 7 and 9 are silicon oxide film, the chemical reaction in forming a film is expressed as follows.

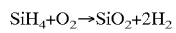

$$SiH_4+O_2 \rightarrow SiO_2+2H_2$$

According to the conventional ferroelectric capacitor C1 and its manufacturing method, there is a fear that hydrogen generated during the film formation process of the oxide films 7 and 9 diffuse into the ferroelectric film 4, and hereby the electric characteristic of the ferroelectric capacitor C1 is to be deteriorated.

The present invention has been achieved in views of aforementioned problem. The object of the present invention is to provide a dielectric capacitor and its manufacturing method capable of showing a good electric characteristic by preventing an external substance such as a reducing element from. entering and diffusing into a dielectric film.

SUMMARY OF THE INVENTION

In the first aspect of the present invention to achieve the above object, there is provided a method for manufacturing a dielectric capacitor including from the first to twelfth steps as follows.

First, a lower electrode film, a dielectric film and an upper electrode film are formed to be piled up from the first to the third steps. A first mask is formed on the upper electrode film in the fourth step. A patterned resist film can be used as the first mask.

In the fifth step, an upper electrode is formed by removing the upper electrode film with the first mask as a mask by, for example, etching. And in the sixth step, the first mask is removed.

In the seventh step, a first barrier film covering the surface of the dielectric film exposed on the surface of the upper electrode in the fifth step is formed. In the next eighth step, a function film is formed on the first barrier film. When the function film is formed, the surface of the dielectric film is covered with the first barrier film. Consequently, the dielectric film does not have chemical influences from the substances generated as the formation of the function film or from the function film itself.

In the ninth step second mask is formed on the function film and, at the same time, on the region including the one corresponding to the upper electrode. A patterned resist film can be used as the second mask, similarly to the first mask. In the tenth step, the function film and the first barrier film are removed with the second mask as a mask by, for example, etching. Then in the eleventh step, the second mask is removed.

In the twelfth step, the dielectric film and the lower electrode film are removed with the function film as a mask, and a capacitor part comprising the lower electrode, the dielectric film, the upper electrode, the first barrier film and the function film is formed.

As described above, the first mask is used as a patterning mask on the upper electrode while the function film is used as a mask to pattern the dielectric film and the lower electrode. This manufacturing method facilitates to pattern the upper electrode in different shape from the dielectric film or the lower electrode. Further, this manufacturing method enables to prepare an appropriate mask in response to the characteristic of each material and to expect the improved patterning accuracy.

Further, the thirteenth step can be added. In the thirteenth step, a second barrier film covering at least the surface of the capacitor part is formed. Therefore, even when a part of the dielectric film is exposed as the side wall part of the capacitor part, the exposed part is to be covered with the second barrier film in the thirteenth step. Even if another film is formed near the capacitor part in the following step, the dielectric film does not have chemical influences from the substances generated as the formation of another film or from another film itself.

Further, the fourteenth step can be added. In the fourteenth step, the second barrier film is etched back until the upper surface of the function film located on the uppermost of the capacitor part is exposed. By etching back, since the second film is removed from the upper surface of the function film, the vertical size of the dielectric capacitor can be kept small. This is advantageous for a semiconductor device provided with the dielectric capacitor to be made flat or highly-integrated. Also, the manufacturing process can be simplified.

In the dielectric capacitor and its manufacturing method according to the present invention, an oxide film can be used as the function film. When the oxide film is formed by CVD method, hydrogen might be generated during the formation process. In this case preferably, the first and second barrier films prevent hydrogen from passing through and reaching the dielectric film. Further preferably, the first and second barrier films consist of oxide tantalum to obtain this function.

Also according to the present invention, the upper electrode, the dielectric film and the lower electrode are formed so that: the contact area of the upper electrode and the dielectric film may be smaller than the area of the upper surface of the dielectric film on which the upper electrode contacts; and/or the contact area of the lower electrode and the dielectric film may be smaller than the area of the bottom surface of the dielectric film on which the lower electrode contacts. In the capacitor part, the region functioning as a capacitor (capacitor region) is the area between the upper electrode and the lower electrode. By forming the upper electrode, the dielectric film and the lower electrode as described above, the region which is not located between the upper electrode and the lower electrode (non-capacitor region) can be saved near the side wall part of the dielectric film. With this structure, even when an impurity such as hydrogen and the like enters and diffuses from the side wall part of the dielectric film to the internal part thereof, the electric characteristic of the capacitor part is not to be deteriorated unless the impurity passes through the non-capacitor region and reaches the capacitor region. In addition, if a barrier film preventing the entry of an impurity is formed at the side wall part of the dielectric film, a synergistic effect on the entry of the impurity can be obtained and the electric characteristic of the dielectric capacitor can be kept in good state.

In the second aspect of the present invention to achieve the above object, there is provided a dielectric capacitor comprising: a lower electrode; a dielectric film formed on the lower electrode; an upper electrode formed on the dielectric film; a function film; a first barrier film located at least within the region between the dielectric film and the function film; and a second barrier film covering at least the side wall part of the dielectric film. And the second barrier film with which the dielectric capacitor is provided is a sidewall provided on a capacitor part comprising the lower electrode, the dielectric film, the upper electrode, the first barrier film and the function film.

With this structure, the first barrier film can prevent the dielectric film and the function film from contacting with each other. Consequently, the dielectric film, the side wall part of which is covered with the second barrier film, does not have chemical influences from the peripheral films including the function film. As a result, the electric characteristic of the dielectric film can be kept in good state.

Preferably, the following method will be adopted to form the second barrier film as the sidewall of the capacitor part. First, a specific material is grown on the capacitor part and the periphery thereof. After that, the grown film is etched back until the function film located on the uppermost of the capacitor part becomes exposed. By etching back, the grown film on the function film is removed and the remained grown film becomes the sidewall of the capacitor part, that is, the second barrier film. The vertical size of the dielectric capacitor can be kept small by forming the second barrier film as the sidewall of the capacitor part. This is advantageous for a semiconductor device provided with the dielectric capacitor to be made flat or highly-integrated.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
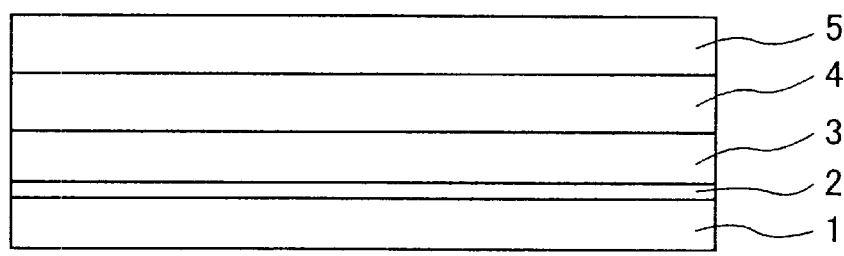
FIG. 1 is a sectional view showing a method for manufacturing a ferroelectric capacitor (Step 1) in the embodiment of the present invention.

Hereinafter, the preferred embodiment of the present invention will be described in reference to the accompanying drawings. Same reference numerals are attached to components having same functions in following description and the accompanying drawings, and a description thereof is omitted.

(First Embodiment)

Figure 10:
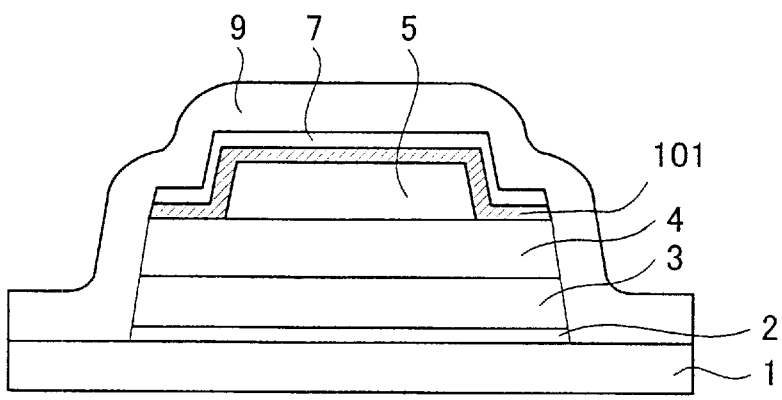
FIG. 10 is a sectional view of a ferroelectric capacitor in the first embodiment of the present invention.

A ferroelectric capacitor C101 and its manufacturing method in this embodiment will be described in reference to FIGS. 1–7 and 10. FIG. 10 is a sectional view of a ferroelectric capacitor C101 in this embodiment, and FIGS. 1–7 are sectional views showing each manufacturing step.

[Step 1-1] An adhesion layer (Ti, 100) 2 and a lower electrode (Pt, 2000) 3 are formed by spattering on an oxide film ($SiO_2$) 1 formed by CVD method. Next, a ferroelectric film (SBT: $SrBi_2Ta_2O_9$, 2000) 4 is formed on the lower electrode 3 with a spin coat method. Further, an upper electrode (Pt, 2000) 5 is formed on the ferroelectric film 4 by spattering (FIG. 1).

Figure 2:
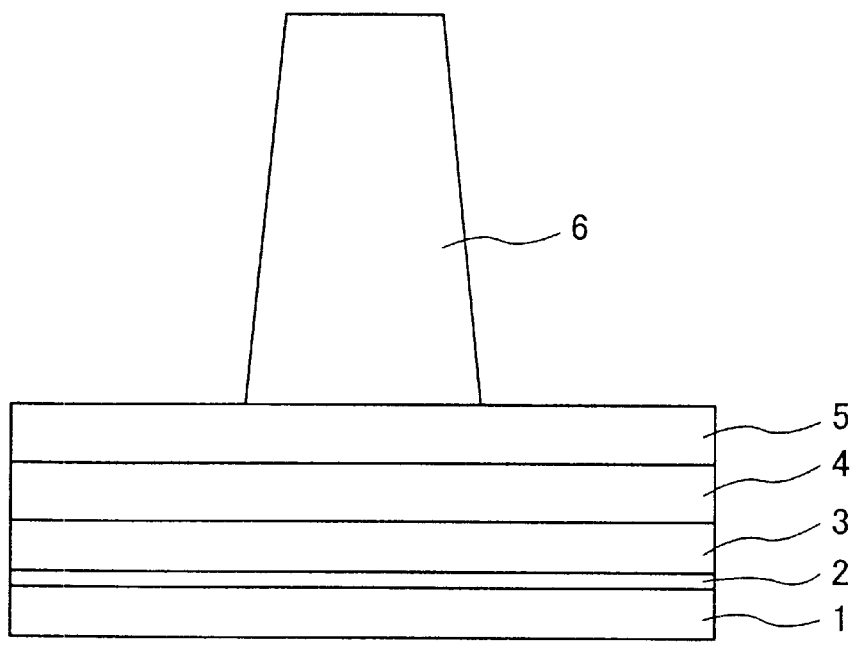
FIG. 2 is a sectional view showing a method for manufacturing a ferroelectric capacitor (Step 2) in the embodiment of the present invention.

[Step 1-2] After a resist film 6 is formed, the resist film 6 is patterned by using a photolithography (FIG. 2).

Figure 3:
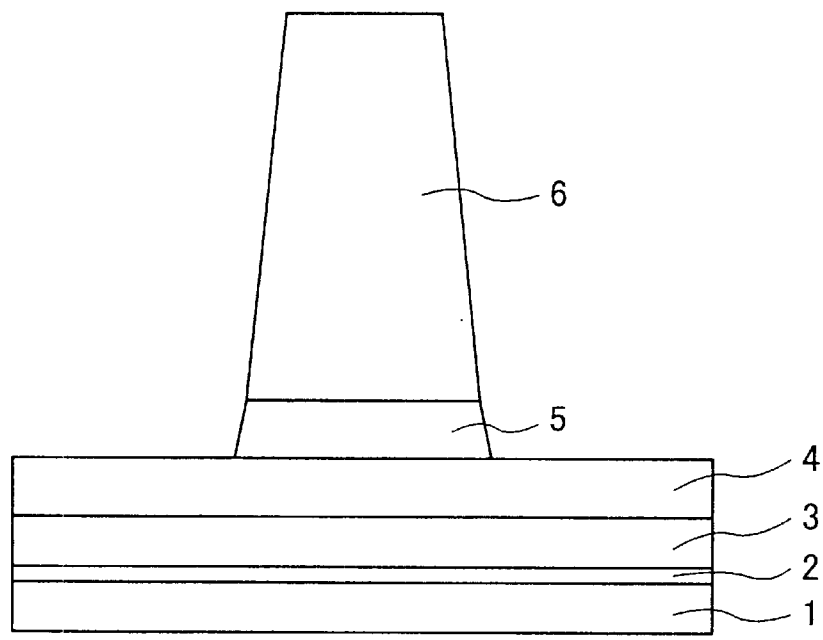
FIG. 3 is a sectional view showing a method for manufacturing a ferroelectric capacitor (Step 3) in the embodiment of the present invention.

[Step 1-3] The upper electrode 5 is etched by using the resist film 6 as a mask. A dry-etching method is used here (FIG. 3).

Figure 4:
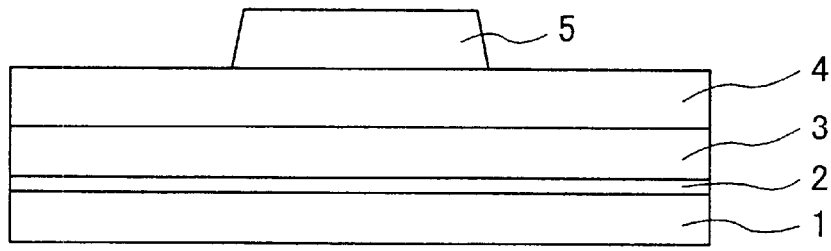
FIG. 4 is a sectional view showing a method for manufacturing a ferroelectric capacitor (Step 4) in the embodiment of the present invention.

[Step 1-4] The resist film 6 is removed by ashing with $O_2$ plasma (FIG. 4).

Figure 5:
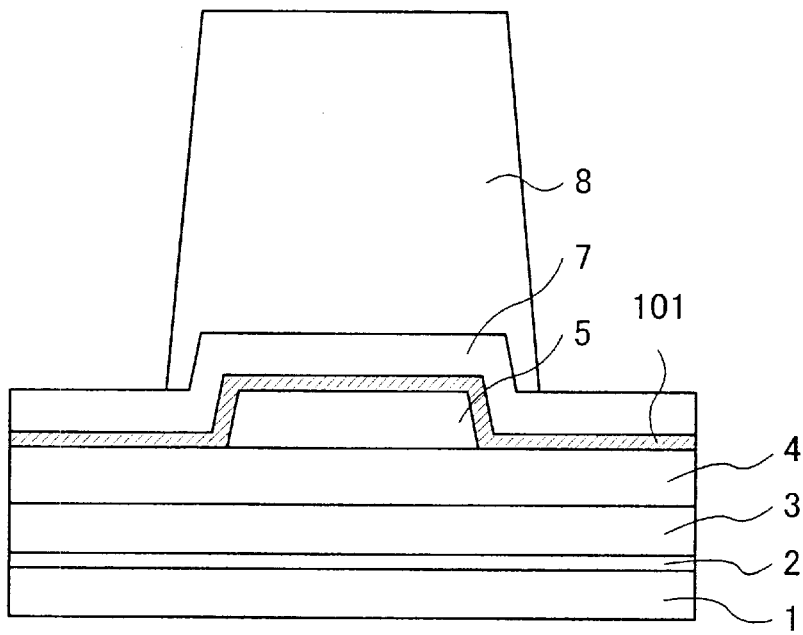
FIG. 5 is a sectional view showing a method for manufacturing a ferroelectric capacitor (Step 5) in the embodiment of the present invention.

[Step 1-5] A first hydrogen diffusion prevention film ($TaO_x$, 1000) 101 is formed by spattering. An oxide film (4000) 7 is formed on the first hydrogen diffusion prevention film 101 by CVD method. After a resist film 8 is formed on the oxide film 7, the resist film 8 is patterned by using a photolithography (FIG. 5). Preferably, NSG film in which no impurity is included and which is low absorbent is adopted as an oxide film 7.

Figure 6:
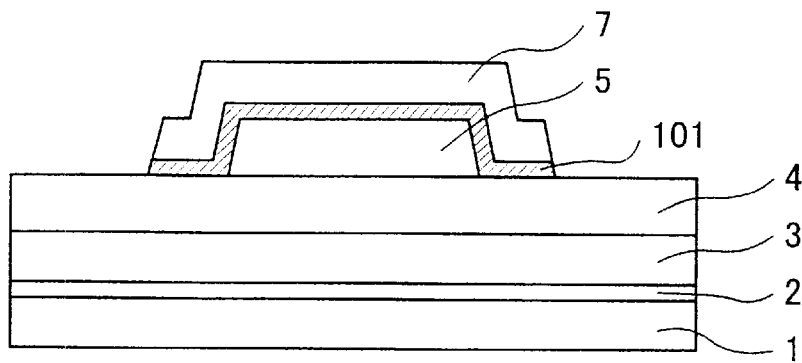
FIG. 6 is a sectional view showing a method for manufacturing a ferroelectric capacitor (Step 6) in the embodiment of the present invention.

[Step 1-6] The oxide film 7 and the first hydrogen diffusion prevention film 101 are etched by using the resist film 8 as a mask. A dry-etching method is used here. And the resist film 8 is removed by ashing with $O_2$ plasma (FIG. 6). Hereby the oxide film 7 as a function film is formed. The patterned oxide film 7 is used as an etching mask in forming a ferroelectric capacitor in the following steps. The barrier film deterioration by an impurity and the film quality deterioration of a ferroelectric film by water can be controlled by using NSG film as the etching mask (oxide film 7).

Figure 7:
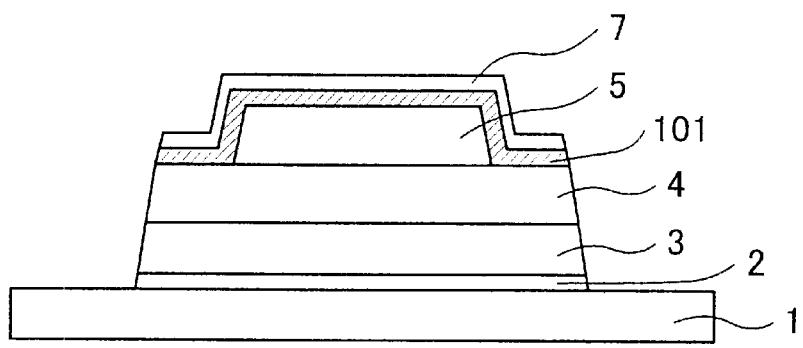
FIG. 7 is a sectional view showing a method for manufacturing a ferroelectric capacitor (Step 7) in the embodiment of the present invention.

[Step 1-7] The oxide film 7 is used as a hard mask, and the ferroelectric film 4, the lower electrode 3 and the adhesion layer 2 are processed with a dry-etching method (FIG. 7).

[Step 1-8] An oxide film (3000) 9 is formed by CVD method (FIG. 10). The oxide film 9 protects the ferroelectric capacitor C101 in the first embodiment from an external atmosphere.

The ferroelectric capacitor C101 in the first embodiment is manufactured through the above steps from 1-1 to 1-8.

There can be given the following point as one of the characteristics of the method for manufacturing a ferroelectric capacitor C101 in the first embodiment: after only the upper electrode 5 is patterned by using the resist film 6 as a mask in step 1-3, the ferroelectric film 4 is etched in step 1-7 by using the oxide film 7 which was formed in step 1-5 and patterned in step 1-6 as a hard mask. According to this method, the following effects can be obtained.

It is more difficult to etch the ferroelectric film 4 than the upper electrode 5. For this reason, if the ferroelectric film 4 as well as the upper electrode 5 are etched at the same time by using the resist film 6 as a mask, the resist film 6 may disappear and the region in the ferroelectric film 4 in which the etching should not be fundamentally achieved may be etched. However, according to the method for manufacturing a ferroelectric capacitor C101 in this embodiment, the resist film 6 is used only for etching the upper electrode 5, and the oxide film 7 formed separately is used as a hard mask to etch the ferroelectric film 4. Since a higher etching selective ratio can be obtained by using the oxide film 7 than by using the resist film 6, the ferroelectric film 4, the lower electrode 3 located under the ferroelectric film 4 and the adhesion layer 2 located under the lower electrode 3 can be patterned with high accuracy.

By the way, the oxide film 7 is formed by CVD method under a hydrogen atmosphere in step 1-5. If hydrogen enter the ferroelectric film 4 at this time, the film quality of a ferroelectric film 4 is to be deteriorated as described above. With regard to this point, the first hydrogen diffusion prevention film 101 is formed on the ferroelectric film 4 in advance before the oxide film 7 is formed, according to a ferroelectric capacitor C101 and its manufacturing method in this embodiment. The ferroelectric film 4 is not to be exposed to a hydrogen atmosphere during the formation of the oxide film 7, with the existence of the first hydrogen diffusion prevention film 101. Consequently, the film quality deterioration of a ferroelectric film 4 can be prevented, and, as a result, there is provided a ferroelectric capacitor C101 with a stable characteristic.

Further, the oxide film 7 can be used as a part an interlayer insulation film. Therefore, after the oxide film 7 is used as an etching mask for the ferroelectric film 4, there is no need to remove the oxide film 7. In other words, the step of removing a mask can be omitted.

On the other hand, the point as one of the characteristics of a ferroelectric capacitor C101 in the first embodiment is that the area of the upper electrode 5 is smaller than those of the ferroelectric film 4. and lower electrode 3. And this characteristic shape formed by adopting this point can be easily achieved since the upper electrode 5 is etched separately from the etchings of the ferroelectric film 4 and lower electrode 3 in a method for manufacturing a ferroelectric capacitor C101 in this embodiment. The effect brought about by this characteristic shape is as follows.

The region functioning as a capacitor in the ferroelectric capacitor 4 is the range located right under the upper electrode 5. In other words, even when an impurity such as hydrogen and the like enters and diffuses from the side wall part of the ferroelectric film 4 to the internal part thereof, the characteristics as a ferroelectric capacitor is not to be deteriorated unless the impurity reaches right under the upper electrode 5. Consequently, the characteristics of a capacitor can be kept in good state without forming a barrier film (for example, metal oxide film) preventing an impurity from entering the side wall part of the ferroelectric film 4.

(Second Embodiment)

Figure 11:
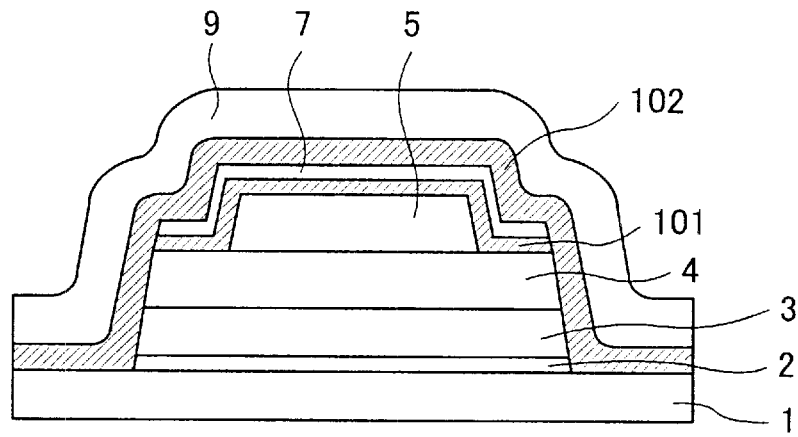
FIG. 11 is a sectional view of a ferroelectric capacitor in the second embodiment of the present invention.

A ferroelectric capacitor C102 and its manufacturing method in this embodiment will be described in reference to FIGS. 1–8 and 11. FIG. 11 is a sectional view of a ferroelectric capacitor C102 in this embodiment, and FIGS. 1-8 are sectional views showing each manufacturing step.

[Step 2-1] An adhesion layer (Ti, 100) 2 and a lower electrode (Pt, 2000) 3 are formed by spattering on an oxide film (SiO$_2$) 1 formed by CVD method. Next, a ferroelectric film (SBT: SrBi$_2$Ta$_2$O$_9$, 2000) 4 is formed on the lower electrode 3 with a spin coat method. Further, an upper electrode (Pt, 2000) 5 is formed on the ferroelectric film 4 by spattering (FIG. 1).

[Step 2-2] After a resist film 6 is formed, the resist film 6 is patterned by using a photolithography (FIG. 2).

[Step 2-3] The upper electrode 5 is etched by using the resist film 6 as a mask. A dry-etching method is used here (FIG. 3).

[Step 2-4] The resist film 6 is removed by ashing with O$_2$ plasma (FIG. 4).

[Step 2-5] A first hydrogen diffusion prevention film (TaO$_x$, 1000) 101 is formed by spattering. An oxide film (4000) 7 is formed on the first hydrogen diffusion prevention film 101 by CVD method. After a resist film 8 is formed on the oxide film 7, the resist film 8 is patterned by using a photolithography (FIG. 5).

[Step 2-6] The oxide film 7 and the first hydrogen diffusion prevention film 101 are etched by using the resist film 8 as a mask. A dry-etching method is used here. And the resist film 8 is removed by ashing with O$_2$ plasma (FIG. 6). Hereby the oxide film 7 as a function film is formed.

[Step 2-7] The oxide film 7 is used as a hard mask, and the ferroelectric film 4, the lower electrode 3 and the adhesion layer 2 are processed with a dry-etching method (FIG. 7).

Figure 8:
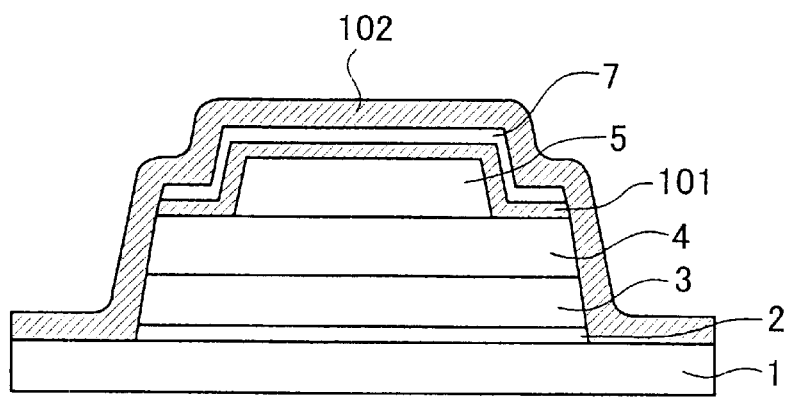
FIG. 8 is a sectional view showing a method for manufacturing a ferroelectric capacitor (Step 8) in the embodiment of the present invention.

[Step 2-8] A second hydrogen diffusion prevention film (TaO$_x$, 1000) 102 is formed by spattering (FIG. 8). It is to be noted that TaO$_x$ of which the first hydrogen diffusion prevention film 101 and the second hydrogen diffusion prevention film 102 consist have a function to take therein and trap hydrogen. Therefore, almina (Al$_2$O$_3$) and the like having the same function can also be adopted as a material of a hydrogen diffusion prevention film.

[Step 2-9] An oxide film (3000) 9 is formed by CVD method (FIG. 11). The oxide film 9 protects the ferroelectric capacitor C102 in the second embodiment from an external atmosphere.

The ferroelectric capacitor C102 in the second embodiment is manufactured through the above steps from 2-1 to 2-9.

According to a ferroelectric capacitor C102 and its manufacturing method in the second embodiment, the same effect as that in a ferroelectric capacitor C101 and its manufacturing method in the first embodiment can be obtained. Also, in the ferroelectric capacitor C102 in the second embodiment, the upper surface of the ferroelectric film 4 is covered with the first hydrogen diffusion prevention film 101 while the side wall part thereof with the second hydrogen diffusion prevention film 102. With this structure, hydrogen can be prevented from entering the internal part of the ferroelectric film 4 not only from the upper surface thereof but also from the side wall part thereof. Consequently, the electric characteristic of the ferroelectric film 4 can be kept in better state.

(Third Embodiment)

Figure 12:
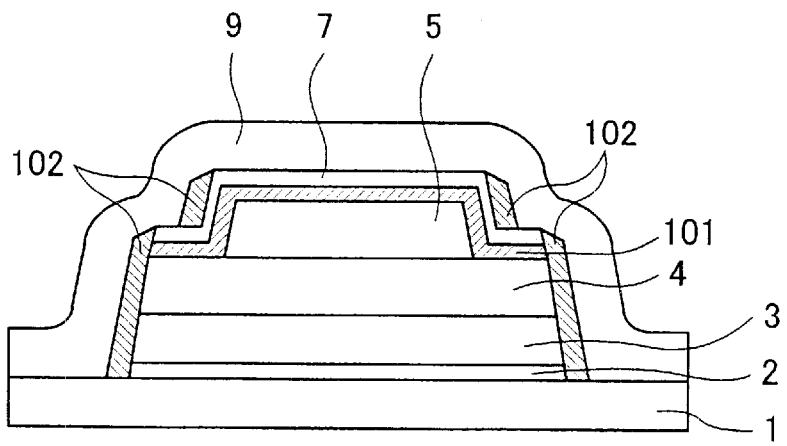
FIG. 12 is a sectional view of a ferroelectric capacitor in the third embodiment of the present invention.
Figure 13:
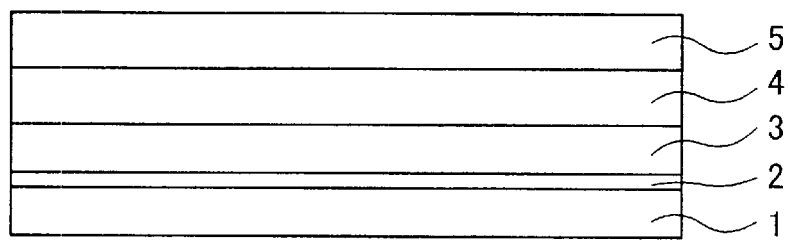
FIG. 13 is a sectional view showing a conventional method for manufacturing a ferroelectric capacitor (Step 1) in the embodiment of the present invention.
Figure 14:
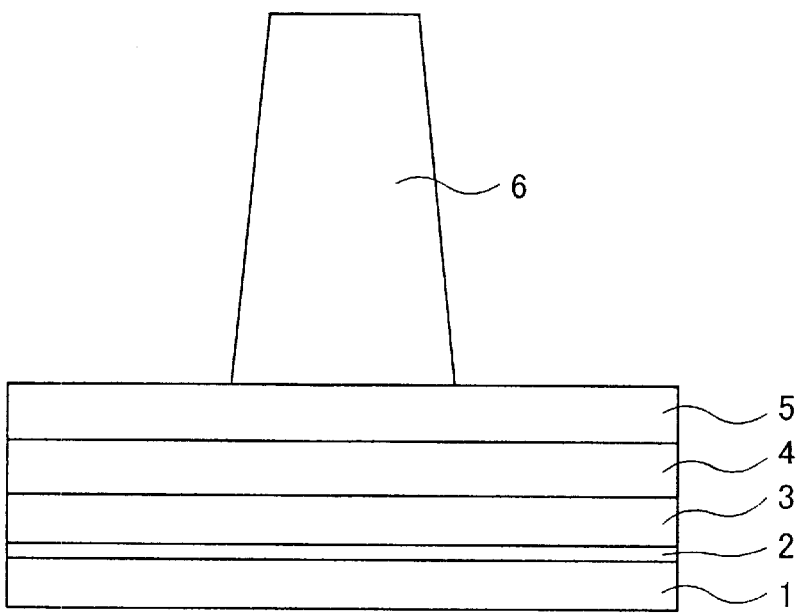
FIG. 14 is a sectional view showing a conventional method for manufacturing a ferroelectric capacitor (Step 2) in the embodiment of the present invention.
Figure 15:
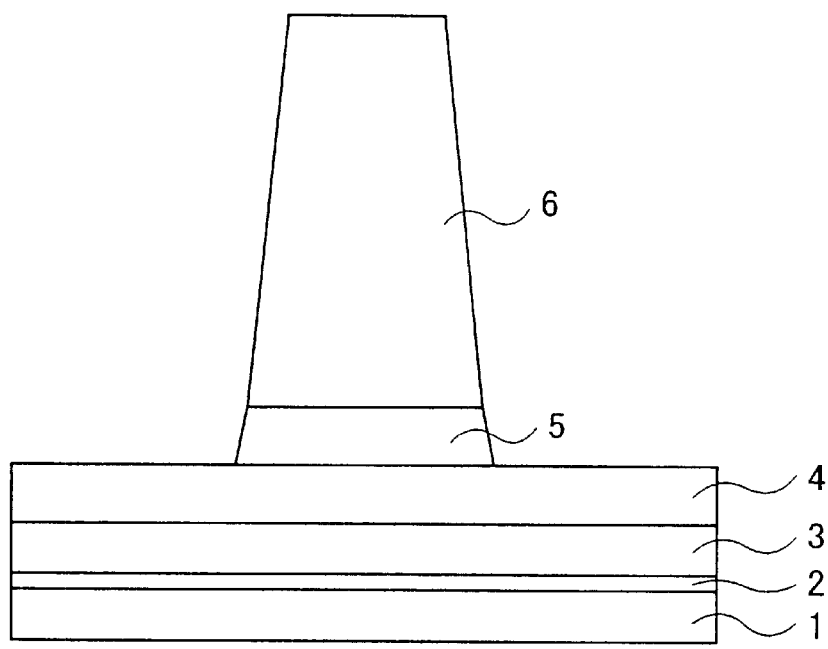
FIG. 15 is a sectional view showing a conventional method for manufacturing a ferroelectric capacitor (Step 3) in the embodiment of the present invention.
Figure 16:
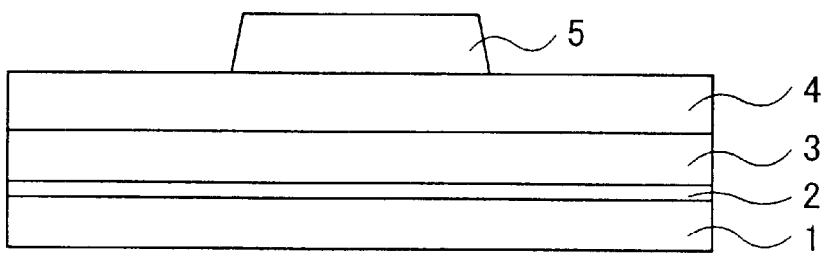
FIG. 16 is a sectional view showing a conventional method for manufacturing a ferroelectric capacitor (Step 4) in the embodiment of the present invention.
Figure 17:
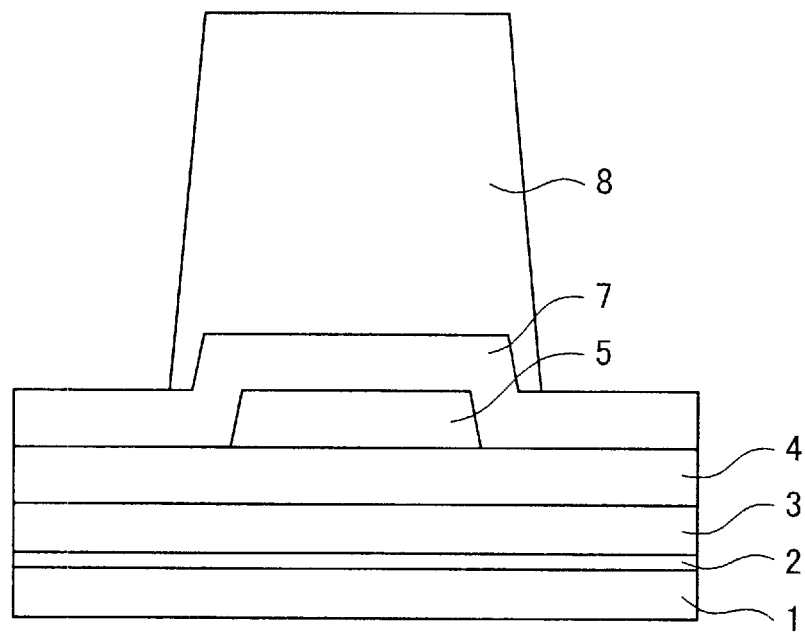
FIG. 17 is a sectional view showing a conventional method for manufacturing a ferroelectric capacitor (Step 5) in the embodiment of the present invention.
Figure 18:
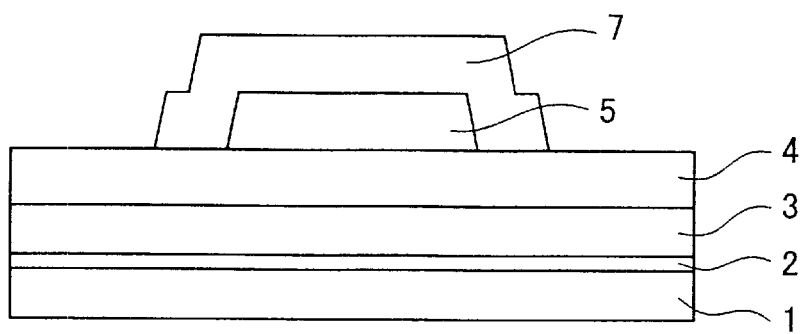
FIG. 18 is a sectional view showing a conventional method for manufacturing a ferroelectric capacitor (Step 6) in the embodiment of the present invention.
Figure 19:
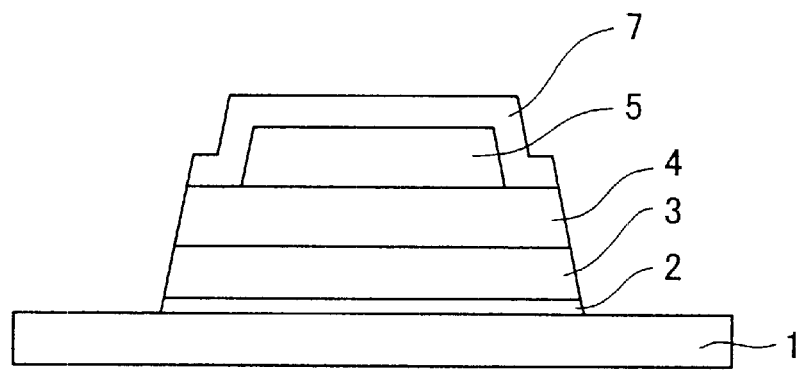
FIG. 19 is a sectional view showing a conventional method for manufacturing a ferroelectric capacitor (Step 7) in the embodiment of the present invention.
Figure 20:
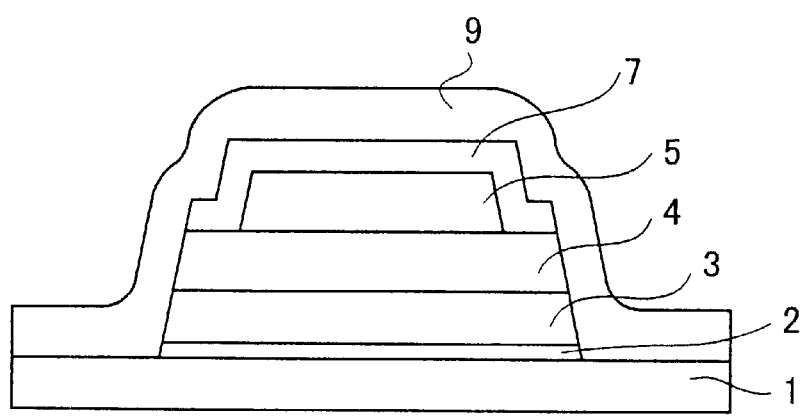
FIG. 20 is a sectional view of a conventional ferroelectric capacitor.

A ferroelectric capacitor C103 and its manufacturing method in this embodiment will be described in reference to FIGS. 1–9 and 12. FIG. 12 is a sectional view of a ferroelectric capacitor C103 in this embodiment, and FIGS. 1–9 are sectional views showing each manufacturing step.

[Step 3-1] An adhesion layer (Ti, 100) 2 and a lower electrode (Pt, 2000) 3 are formed by spattering on an oxide film (SiO$_2$) 1 formed by CVD method. Next, a ferroelectric film (SBT: SrBi$_2$Ta$_2$O$_9$, 2000) 4 is formed on the lower electrode 3 with a spin coat method. Further, an upper electrode (Pt, 2000) 5 is formed on the ferroelectric film 4 by spattering (FIG. 1).

[Step 3-2] After a resist film 6 is formed, the resist film 6 is patterned by using a photolithography (FIG. 2).

[Step 3-3] The upper electrode 5 is etched by using the resist film 6 as a mask. A dry-etching method is used here (FIG. 3).

[Step 3-4] The resist film 6 is removed by ashing with O$_2$ plasma (FIG. 4).

[Step 3-5] A first hydrogen diffusion prevention film (TaO$_x$, 1000) 101 is formed by spattering. An oxide film (4000) 7 is formed on the first hydrogen diffusion prevention film 101 by CVD method. After a resist film 8 is formed on the oxide film 7, the resist film 8 is patterned by using a photolithography (FIG. 5). Preferably, NSG film in which no impurity is included and which is low absorbent is adopted as an oxide film 7.

[Step 3-6] The oxide film 7 and the first hydrogen diffusion prevention film 101 are etched by using the resist film 8 as a mask. A dry-etching method is used here. And the resist film 8 is removed by ashing with O$_2$ plasma (FIG. 6). Hereby the oxide film 7 as a function film is formed. The patterned oxide film 7 is used as an etching mask in forming a ferroelectric capacitor in the following steps. The barrier film deterioration by an impurity and the film quality deterioration of a ferroelectric film by water can be controlled by using NSG film as the etching mask (oxide film 7).

[Step 3-7] The oxide film 7 is used as a hard mask, and the ferroelectric film 4, the lower electrode 3 and the adhesion layer 2 are processed with a dry-etching method (FIG. 7).

[Step 3-8] A second hydrogen diffusion prevention film (TaO$_x$, 1000) 102 is formed by spattering (FIG. 8). It is to be noted that TaO$_x$ of which the first hydrogen diffusion prevention film 101 and the second hydrogen diffusion prevention film 102 consist have a function to take therein and trap hydrogen. Therefore, almina (Al$_2$O$_3$) and the like having the same function can also be adopted as a material of a hydrogen. diffusion prevention film.

Figure 9:
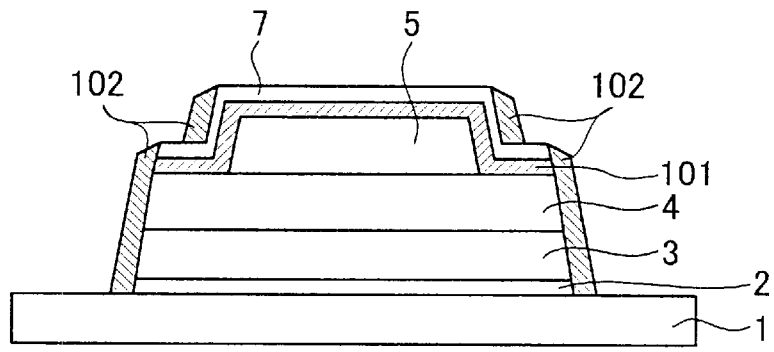
FIG. 9 is a sectional view showing a method for manufacturing a ferroelectric capacitor (Step 9) in the embodiment of the present invention.

[Step 3-9] The whole surface of the second hydrogen diffusion prevention film 102 is etched back by using, for example, a dry-etching method with chlorine gas. At this time, the second hydrogen diffusion prevention film 102 is etched back until the upper surface of the oxide film 7 is exposed. As a result, the second hydrogen diffusion prevention film 102 remains as a sidewall only at the side wall part of the ferroelectric capacitor C103 including the side wall part of the ferroelectric film 4 (FIG. 9). By this step, in other words, a sidewall comprising the second hydrogen diffusion prevention film 102 is formed on a capacitor part comprising the lower electrode, the dielectric capacitor, the upper electrode, the first barrier film and the oxide film 7 as the function film.

[Step 3-10] An oxide film (3000) 9 is formed by CVD method (FIG. 12). The oxide film 9 protects the ferroelectric capacitor C103 in the third embodiment from an external atmosphere. Preferably, NSG film is adopted as an oxide film 9, similarly to the oxide film 7.

The ferroelectric capacitor C103 in the third embodiment is manufactured through the above steps from 3-1 to 3-10.

According to a ferroelectric capacitor C103 and its manufacturing method in the third embodiment, the same effect as those in ferroelectric capacitors C101 and C102 and their manufacturing methods in the first and second embodiments can be obtained.

In addition, when a method for manufacturing a ferroelectric capacitor C103 in the third embodiment is adopted, the second hydrogen diffusion prevention film 102 is self-coordinately formed on the part at which it is effective to prevent hydrogen from entering the ferroelectric film 4 from the oxide film 9, that is, only on the side wall part of the ferroelectric film 4. As described above, according to a method for manufacturing a ferroelectric capacitor C103 in the third embodiment, there is no need to take a photolithography step separately to remove the second hydrogen diffusion prevention film 102 which has grown on the region other than the one in which the ferroelectric capacitor C103 is formed. Therefore, the efficiency of manufacturing a ferroelectric capacitor can be increased and the manufacturing cost can be eliminated.

Further, since the second hydrogen diffusion prevention film 102 does not exist on the upper surface of the oxide film 7, the height of the ferroelectric capacitor C103 is to be minimized at a required level. This is advantageous for an entire part of a semiconductor device provided with the ferroelectric capacitor C103 to be made flat.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

What is claimed is:

1. A method for manufacturing dielectric capacitor comprising: forming a lower electrode film;
   forming a dielectric film consisting of metal oxide on the lower electrode;
   forming an upper electrode film on the dielectric film;
   forming a first mask on the upper electrode film;
   patterning an upper electrode by removing the upper electrode film with the first mask;
   removing the first mask after patterning the upper electrode;
   forming a first barrier film covering the surface of the upper electrode and the surface of the dielectric film exposed by patterning the upper electrode;
   forming a function film on the first barrier film;
   forming a second mask on the function film which is corresponding to the upper electrode;
   removing the function film and the first barrier film with the second mask;
   removing the second mask after removing the function film; and
   patterning the dielectric film and the lower electrode film with the function film as a mask.

2. A method for manufacturing dielectric capacitor according to claim 1 wherein the first barrier film prevents hydrogen from passing through.

3. A method for manufacturing dielectric capacitor according to claim 2 wherein the first barrier film consists of oxide tantalum.

4. A method for manufacturing dielectric capacitor according to claim 1 further comprising forming a second barrier film covering the lower electrode, the dielectric film, the upper electrode, the first barrier film and the function film, after patterning the dielectric film and the lower electrode.

5. A method for manufacturing dielectric capacitor according to claim 4 further comprising etching back the second barrier film until the upper surface of the function film is exposed.

6. A method for manufacturing dielectric capacitor according to claim 4 wherein the second barrier film prevents hydrogen from passing through.

7. A method for manufacturing dielectric capacitor according to claim 6 wherein the second barrier film consists of oxide tantalum.

8. A method for manufacturing dielectric capacitor according to claim 1 wherein: the bottom surface of the upper electrode is smaller than the top surface of the patterned dielectric film.

9. A method for manufacturing dielectric capacitor according to claim 1 wherein the function film is an oxide film.

10. A method for manufacturing dielectric capacitor according to claim 9 wherein the function film is formed by a CVD process.

11. A method for manufacturing dielectric capacitor according to claim 9 wherein the function film is a low absorbent film.

12. A method for manufacturing dielectric capacitor according to claim 11 wherein the low absorbent film is a non-doped silicate glass film.

13. A method for manufacturing dielectric capacitor comprising;
   providing a substrate having a main surface;
   forming a lower electrode film, a dielectric film and an upper electrode film on the main surface of the substrate in that order;
   patterning the upper electrode film to form an upper electrode and to expose a part of the dielectric film, wherein the upper electrode film is patterned with a resist formed on the upper electrode film;
   forming a barrier film covering the upper electrode and the exposed portion of the dielectric film;
   forming a mask on the barrier film; and
   patterning the dielectric film and the lower electrode film with the mask.

* * * * *